(12) United States Patent
Cho (10) Patent No.: US 6,175,260 B1
(45) Date of Patent: Jan. 16, 2001

(54) TIME DELAY APPARATUS USING TRANSFER CONDUCTANCE

(75) Inventor: Gea-ok Cho, Suwon (KR)

(73) Assignee: Samsung Electronics Co., Ltd., Suwon (KR)

(*) Notice: Under 35 U.S.C. 154(b), the term of this patent shall be extended for 0 days.

(21) Appl. No.: 09/223,760

(22) Filed: Dec. 31, 1998

(51) Int. Cl.[7] .................................................. H03H 11/26
(52) U.S. Cl. ........................ 327/280; 327/276; 327/287; 327/553
(58) Field of Search .................................. 327/261–289, 327/551–559

(56) References Cited

U.S. PATENT DOCUMENTS

| | | | | |
|---|---|---|---|---|
| 4,801,827 | * | 1/1989 | Metz | 327/280 |
| 5,614,858 | * | 3/1997 | Pennisi | 327/552 |
| 5,929,699 | * | 7/1999 | Lewicki | 327/552 |

* cited by examiner

Primary Examiner—Toan Tran
(74) Attorney, Agent, or Firm—Staas & Halsey LLP (57) ABSTRACT

A time delay apparatus using a transfer conductance. The time delay apparatus using an all-band pass filter can constitute the all-band pass filter having a required time delay with maintaining a frequency gain of an input signal by using a transfer conductance and the low frequency pass filter and easily control an amount of the time delay by varying the transfer conductance of the MOS transistor from outside.

41 Claims, 4 Drawing Sheets

TIME DELAY APPARATUS USING TRANSFER CONDUCTANCE

BACKGROUND OF THE INVENTION

1. Field of the Invention

The present invention relates to a time delay apparatus for a system which requires time delay of a signal, and, more particularly, the present invention relates to a time delay apparatus including a transfer conductance portion which uses transfer conductance to control a signal from an external device and obtain a desirable time delay without influencing a frequency characteristic, by using a MOS (Metal-Oxide Semiconductor) transistor.

2. Description of the Related Art

Generally, in signal processing system, time delay of a signal is inevitably generated in a path between components. For example, a signal passing through a simple buffer generates a time delay of at least 2 nanoseconds (ns). Further, for example, a time delay dependent on holding time is generated in a sample-and-hold circuit installed in an analog to digital converter (A/D converter) for converting an analog signal to a digital signal.

However, in a system for processing an inputted multiplexed signal by using the time delay characteristics of each signal, the time delay between signals is different because the path for inputting and passing through each signal generated from an external device is not the same. Accordingly, adding a time delay according to the path through which the signal passes to the time characteristics of an ordinarily generated signal can produce a bad influence on the system.

A conventional time delay apparatus will be described hereinbelow with reference to a time delay control apparatus applied to a digital video disk player (DVDP) which is a system for processing a multiplexed signal and standardized as an alternative of a new video and voice storing device.

Figure 1:
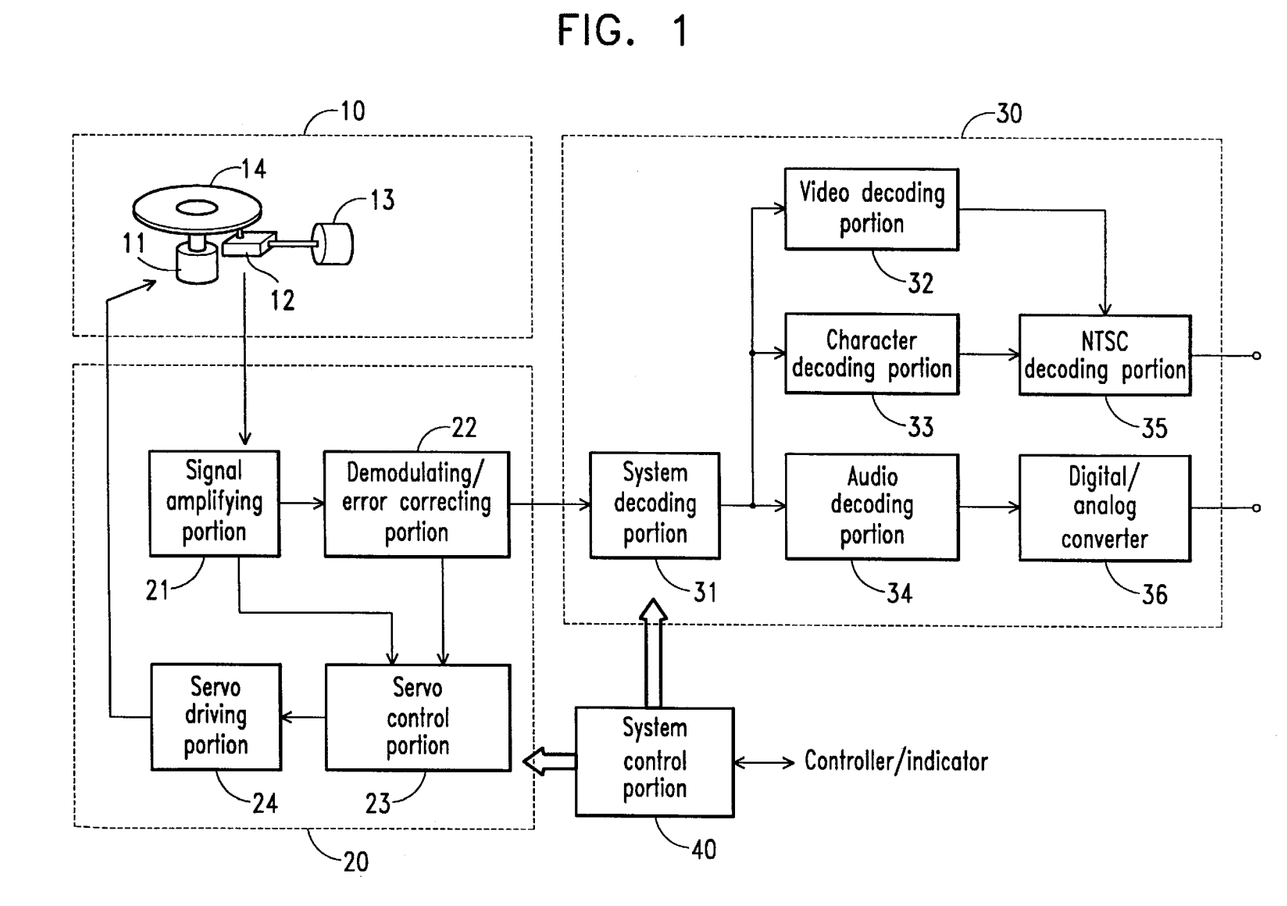
FIG. 1 is a block diagram of a conventional digital video disk player.

A block diagram of the conventional digital video disk player is shown in FIG. 1. The digital video disk player includes: a data collecting portion 10 for collecting data from a high-density optical disk via a head; a data signal processing portion 20 which outputs the data as a bit stream by executing demodulation and error correction of the collected data from the data collecting portion 10 and feeds back the data to the data collecting portion 10 by detecting a tracking error; a signal reproducing portion 30 for generating audio and video outputs by decoding each audio, character and video signal among the bit streams inputted from the data signal processing portion 20; and a system control portion 40 for inputting a control signal for display and operation and a control signal for a whole system into the data signal processing portion 20 and the signal reproducing portion 30, thereby providing a user interface.

The data collecting portion 10 includes: an optical head 12 for directly collecting data from the high-density optical disk 14 which records data along a track; a disk motor 11 for rotating the optical head 12 at a constant speed; and a transporting motor 13 for transporting the optical head 12 to an exact position on the optical disk 14.

Moreover, the data signal processing portion 20 includes: a signal amplifying portion 21 for outputting the signal received from the data collecting portion 10 as a safe signal by amplifying the same; a demodulating/error correcting portion 22 for applying the inputted signal from the signal amplifying portion 21 to the signal reproducing portion 30 as a bit stream by demodulating the inputted signal from the signal amplifying portion 21 and detecting and recovering the error generated during recording of the signal on the optical disk 14 by error correcting code; a servo control portion 23 which generates a track control signal of the data collecting portion 10 by using the track error of the data collecting portion 10 which is detected by using four (4) signals, such as a first, a second, a third and a fourth signal inputted from the signal amplifying portion 21, and a control signal inputted from the demodulating/error correcting portion 22; and a servo driving portion 24 for converting the track control signal inputted from the servo control portion 23 to a motor driving signal of the data collecting portion 10.

The signal reproducing portion 30 includes: a system decoding portion 31 for separating the inputted signal bit stream from the demodulating/error correcting portion 22 of the signal processing portion 20 into video, character and audio signals according to data characteristics; a video decoding portion 32 for decoding the separated video signal stream from the system decoding portion 31; a character decoding portion 33 for encoding the separated character signal stream from the system decoding portion 31; an audio decoding portion 34 for decoding the separated audio signal stream from the system decoding portion 31; a National Television Standard Committee (NTSC) decoding portion 35 for converting the inputted signal from the video decoding portion 32 and the character decoding portion 33 into a NTSC signal which is a displaying method of a broadcasting and a video player; and a Digital to Analog (D/A) converter 36 for converting the inputted signal from the audio decoding portion 34 into the audio signal.

The servo-control portion 23 will now be described in detail hereinbelow. The servo-control portion 23 receives and processes a multiplexed signal from the signal amplifying portion 21 and the demodulating/error correcting portion 22. That is, to execute track error detection for a beam used for the digital video disk player, the four signals from the signal amplifying portion 21 are received and the phase difference between a first composite signal and a second composite signal is detected, wherein the first composite signal is a composite of the first and the third signals and the second composite signal is the composite of the second and the fourth signals. Accordingly, the signal track on the optical disk 14 is discriminated.

Then, respectively different time delays can be generated by an offset of a pickup process and a delay component of the signal amplifying portion 21, etc., because each signal uses respectively different channels.

Accordingly, when the mechanism for correcting the exact position of the optical head portion 12 causes error because of the phase difference generated from the track error and the time delay according to the offset of the pickup process and the delay component of the signal amplifying portion 21, deviation from the track can be generated at the servo-control portion 23 which detects the phase difference between the first composite signal and the second composite signal. Consequently, deviation from the track may cause discontinuous data collecting.

In addition to the above-described time delay, a time delay of the signal is needed for the general signal processing system for processing a single signal. The time delay can be obtained by using various methods, such as using a passive component or an active component. Generally, the time delay method can be roughly classified into a method using the passive component and a method using the active component.

The most simple time delay method using a passive element is to use a capacitor. By using the capacitor characteristics, that is, the capacitor charges to a predetermined value according to an inputted signal and discharges when the inputted signal is eliminated and the speed of charge and discharge is determined by the capacitance of the capacitor. Further, the time constant is changed by changing the capacitance of the capacitor and the required time delay can be obtained via change of the time constant.

Moreover, the active delay component having a naturally discrete time delay characteristic, such as a flip-flop, can delay time by continuously connecting the same in a serial manner. In the time delay method using a flip-flop, the degree of the time delay is determined by a the frequency of a clock applied to the delay component. By changing the clock frequency of an oscillator, the degree of the time delay is controllable.

The time delay method using the active delay component is preferably used for a system requiring a discrete time delay, and a required time delay signal between each flip-flop can be output by using the signal from an external device when the active delay component is installed on one chip.

Another time delay method using the active component is to use an all-band pass filter. To obtain characteristics of the all-band pass filter, a low pass filter (LPF) consisting of two operational amplifiers is used so that the LPF obtains two poles and two roots. By using the LPF, the parameter of the all-band pass filter having a transfer function, such as Function 1 below is determined.

$$H(s) = \frac{s^2 - cs + d}{s^2 + as + b} \quad \text{(Function 1)}$$

In the Function 1, a is a primary coefficient of the denominator polynomial expression of the transfer function, b is a constant of the denominator polynomial expression of the transfer function, c is a primary coefficient of the numerator polynomial expression of the transfer function and d is a constant of numerator polynomial expression of the transfer function.

Generally, for forming the low frequency pass filter of the all-band pass filter, a resistance component and a capacitor component are required. To obtain a required amount of the time delay at the inputted signal, the resistance component and the capacitor component are changed.

When the capacitance of the capacitor component is determined, a time delay amount is fixed in the time delay method using the capacitor component. To obtain the exactly required amount of the time delay, the precise capacitance of the capacitor component is changed via trial and error. When the time delay function is provided in one chip, it is difficult to change the amount of the time delay from the outside.

Moreover, the time delay method using the active delay component has some problems. For example, it is difficult to determine the degree of the time delay actively because the degree of the time delay is fully determined by the frequency of a clock used for the delay component. The resolution of the time delay cannot be improved to a predetermined level because of a limit of the clock speed and the characteristics of the active delay component. The active time delay component itself inevitably generates the time delay. To obtain an exact time delay, an additional means is required because the time delay method using the active delay component is only applied to the discrete signal.

Consequently, the degree of the time delay is fixed and, accordingly, it is difficult to control the time delay from the outside in the conventional time delay method. Moreover, in the conventional time delay method, the resolution of the time delay is restricted.

SUMMARY OF THE INVENTION

It is an object of the present invention to provide a time delay apparatus which uses a transfer conductance for easily controlling an amount of a time delay.

In accordance with embodiments of the present invention, a transfer conductance portion comprises an active component for generating a transfer conductance, which becomes a parameter of a transfer function of an all-band pass filter having a predetermined input structure. A low frequency pass filtering means comprises a low frequency pass filter portion for executing low frequency pass filtering by receiving an output from the transfer conductance portion. The transfer conductance portion is multi-connected to the low frequency pass filtering means. A feedback means feeds back a final output to the input of each low frequency pass filter portion and the output of the final transfer conductance portion to an initial input. Accordingly, the time delay apparatus executing the time delay by using the transfer conductance is provided.

According to the present invention, the time delay is easily controlled by maintaining a frequency characteristic of the inputted signal and simultaneously obtaining a required time delay.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Reference will now be made in detail to the preferred embodiments of the present invention. The objects, characteristics and advantages of the present invention will be more clearly understood through the preferred embodiments referring to the attached drawings, wherein like reference numerals refer to like elements throughout.

Figure 2:
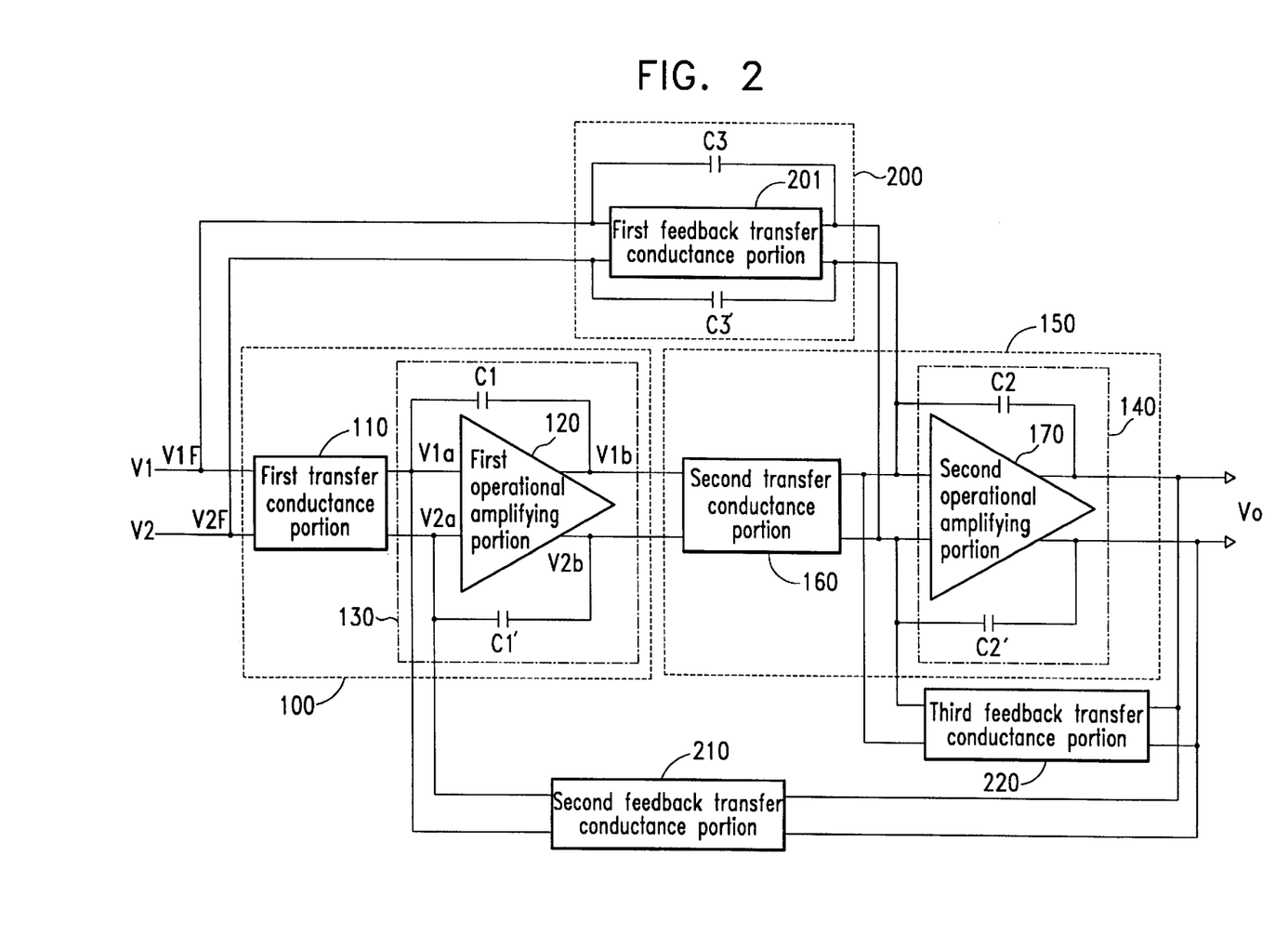
FIG. 2 is a block diagram showing an example of a time delay apparatus using a transfer conductance in accordance with the present invention.

A time delay apparatus using a transfer conductance in accordance with the present invention will now be described hereinbelow with reference to FIG. 2. FIG. 2 is a block diagram of an example of the time delay apparatus using transfer conductance in accordance with the present invention. In the following description, when the detailed description related to disclosed function and structure is well known, the detailed description will be omitted.

The time delay apparatus using transfer conductance according to a preferred embodiment of the present invention is formed by connecting a first low frequency pass filtering means 100 and a second low frequency pass filtering means 150.

The first low frequency pass filtering means 100 comprises a first transfer conductance portion 110 and a first low frequency pass filter portion 130 to execute low frequency filtering. The first transfer conductance portion 110 generates a first transfer conductance by receiving first and second input signals V1 and V2. The first low frequency pass filter portion 130 comprises capacitors C1 and C1' and a first operational amplifying portion 120. The first low frequency pass filter 130 amplifies the received output of the first transfer conductance portion 110 and feeds back the output to an input.

The second low frequency pass filtering means 150 comprises a second transfer conductance portion 160 and a second low frequency pass filter portion 140 to execute low frequency filtering. The second transfer conductance portion 160 receives the outputs of the first low frequency pass filtering means 100 and the first low frequency pass filter portion 130 and generates a second transfer conductance which is a predetermined multiple of the first transfer conductance, and preferably twice the amount of the first transfer conductance. The second low frequency pass filter portion 140 comprises capacitors C2 and C2' and a second operational amplifying portion 170. The second low frequency pass filter portion 140 amplifies the received output of the second transfer conductance portion 160 and feeds back the output to an input.

Moreover, a first feedback portion 200 feeds back the output of the second transfer conductance portion 160 to an input terminal of the first low frequency pass filtering means 100 with a first feedback transfer conductance portion 201 and capacitors C3 and C3', connected in parallel. A second feedback transfer conductance portion 210 feeds back the output of the second operational amplifying portion 170 to the input terminal of the first operational amplifying portion 120. A third feedback transfer conductance portion 220 feeds back the output of the second operational amplifying portion 170 to the input terminal of the second operational amplifying portion 170.

The operation of the time delay apparatus using the transfer conductance and having above-described structure, according to the present invention, will now be described in detail below with reference to FIG. 2.

First and second input signals V1 and V2 are generated from the same source. Such dual input structure is advantageous with respect to noise and is also advantageous with respect to extending an active range of gain easily. Especially, in an apparatus equipped with a differential amplifier as a unit component, it is well known that the noise is effectively reduced according to a Common Mode Rejection Ratio (CMRR).

In accordance with the present invention, the structures of the first low frequency pass filtering means 100 and the second low frequency pass filtering means 150 are the same, except that the transfer conductance of the second transfer conductance portion 160 is twice that of the first transfer conductance portion 110. Accordingly, the transfer conductances of the first transfer conductance portion 110 and the first, second and the third feedback transfer conductance portions 201, 210 and 220 are the same.

First, the first operational amplifying portion 120 receives the first input signal V1 via the first transfer conductance portion 110. The capacitors C1 and C1' feed back the output of the first operational amplifying portion 120 to the input terminal of the first operational amplifying portion 120. Consequently, one pole is generated on the transfer function.

The output of the first operational amplifying portion 120 is inputted into the second operational amplifying portion 170 via the second transfer conductance portion 160, to execute the low frequency pass filtering and to generate another pole on the transfer function.

Then, the output of the second transfer conductance portion 160 is fed back to the input terminal of the first transfer conductance portion 110 by the first feedback portion 200, connected in parallel. The output of the second operational amplifying portion 170 is fed back to the input terminal of the second operational amplifying portion 170 by the capacitors C2 and C2' and the third feedback transfer conductance portion 220, connected in parallel. Moreover, the output of the second operational amplifying portion 170 is fed back to the input of the first operational amplifying portion 120 by the second feedback transfer conductance portion 210.

In accordance with preferred embodiments of the present invention, to obtain the all-band pass filter having the transfer function such as the Function 1, the transfer conductance of the second transfer conductance portion 160 is preferably twice that of the first transfer conductance portion 110. The transfer conductances of the first and the second feedback transfer conductance portions 201 and 210 determine the parameter of the transfer function of the all-band pass filter.

Figure 3:
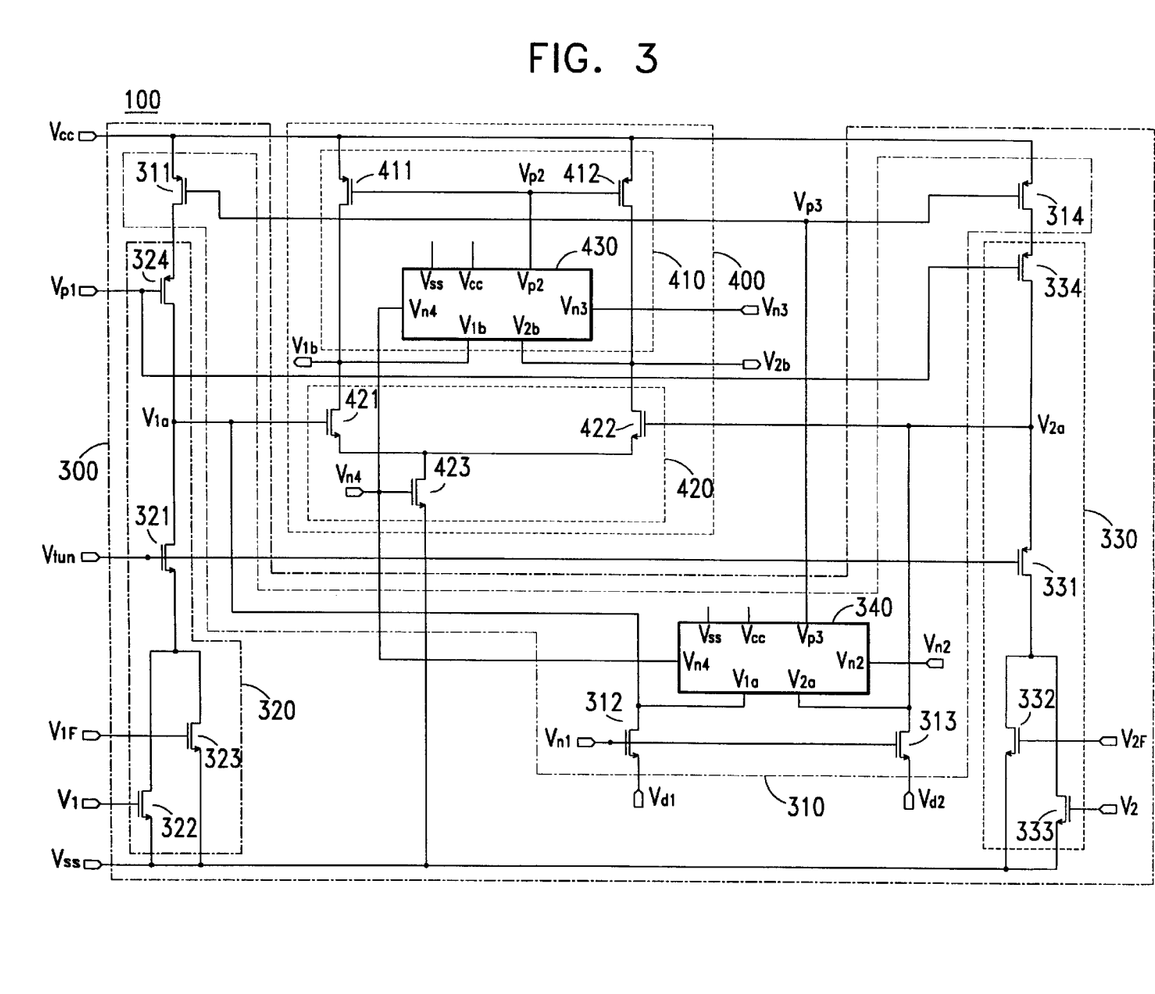
FIG. 3 is a detailed circuit diagram of a first transfer conductance portion and a first operational amplifying portion shown in FIG. 2 in accordance with the present invention.
Figure 4:
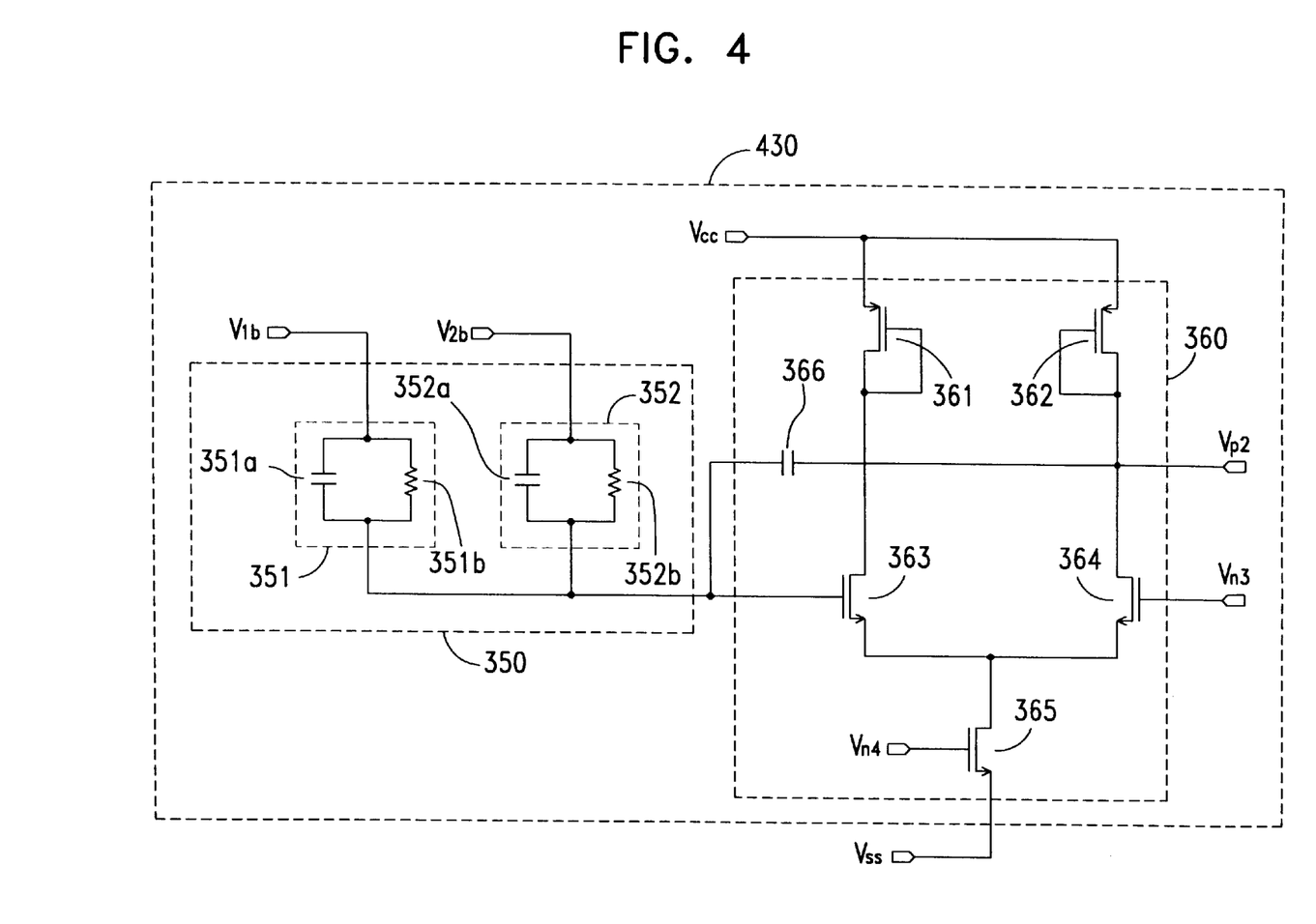
FIG. 4 is a detailed circuit diagram of a common mode rejection ratio control portion in accordance with the present invention.

FIG. 3 is a detailed circuit diagram showing the first transfer conductance portion 110 and the first operational amplifying portion 120 shown in FIG. 2. FIG. 4 is a detailed circuit diagram of a common mode rejection ratio control portion 430 shown in FIG. 3.

The first transfer conductance portion 110 and the first operational amplifying portion 120, which are included in the first low frequency pass filtering means 100 of the time delay apparatus using the conductance according to the present invention, will now be described hereinbelow with reference to FIGS. 3 and 4.

The first transfer conductance portion 110 includes: a first transfer conductance varying portion 320 for varying the transfer conductance according to a delay control signal Vtun by receiving the first input signal V1 and the first feedback signal V1F required for the time delay; a second transfer conductance varying portion 330 for varying the transfer conductance according to the delay control signal Vtun by receiving the second input signal V2 and the second feedback signal V2F, which are respectively generated from the same source as those of the first input signal V1 and the first feedback signal V1F; and a first common mode rejection ratio improving portion 310 for improving the first common mode rejection ratio by receiving the outputs V1a and V2a of the first and the second transfer conductance varying portions 320 and 330.

The first operational amplifying portion 400 includes: a differential amplifying portion 420 which receives the outputs V1a and V2a of the first and the second transfer conductance varying portions 320 and 330, and differentially amplifies and outputs the same; and a second common mode rejection ratio improving portion 410 for improving the common mode rejection ratio by receiving the outputs V1b and V2b of the differential amplifying portion 420.

The first transfer conductance varying portion 320 includes: a MOS transistor 322 to which the first input signal V1 is applied via the gate and of which the source is connected to a negative electrode supply source Vss; a MOS transistor 323 to which the first feedback signal V1F is applied via the gate and of which the source is connected to the negative electrode supply source Vss; a MOS transistor 321 to which is supplied the delay control signal Vtun for controlling the transfer conductance via the gate and which connects the source to a common contact between drains of the MOS transistors 322 and 323; and a MOS transistor 324 for controlling transfer conductance to which a first enable signal Vp1 is applied via the gate, and which supplies the output V1a to the first operational amplifying portion 400 via the source connected to the drain of the MOS transistor 321.

The second transfer conductance varying portion 330 includes: a MOS transistor 333 to which the second input signal V2 is applied via a gate and of which the source is connected to the negative electrode supply source Vss; a MOS transistor 332 to which the second feedback signal V2F is applied via a gate and of which the source is connected to the negative electrode supply source Vss; a MOS transistor 331 to which the delay control signal Vtun for controlling the transfer conductance is supplied via the gate, and which connects the source to the common contact between drains of the MOS transistors 332 and 333; and a MOS transistor 334 for controlling transfer conductance to which the first enable signal Vp1 is applied via the gate and which supplies the output V2Pa to the first operational amplifying portion 400 via the source connected to the drain of the MOS transistor 331.

The first common mode rejection ratio improving portion 310 includes: a first common mode rejection ratio control portion 340 for generating a control signal Vp3, and which receives the outputs V1a and V2a of the first and the second transfer conductance varying portions 320 and 330, respectively, and improves the common mode rejection ratio; a MOS transistor 311 and a MOS transistor 314 which receive the control signal Vp3 via the respective gates, and improves the common mode rejection ratio to the output V1a of the first transfer conductance varying portion 320 and the output V2a of the second transfer conductance varying portion 330, and respectively connect each drain to a positive electrode supply source Vcc and combine respective sources with the first and the second transfer conductance varying portions 320 and 330; a MOS transistor 312 to which a third enable signal Vn1 is applied via the gate and of which the drain is combined with the first transfer conductance varying portion 320; and a MOS transistor 313 to which the third enable signal Vn1 is applied via the gate and of which the drain is combined with the second transfer conductance varying portion 330.

The differential amplifying portion 420 includes: a MOS transistor 421 to which the output V1a of the first transfer conductance varying portion 320 is applied via the gate and which amplifies and outputs the same via the drain; a MOS transistor 422 which constitutes the differential amplifier portion with the MOS transistor 421 according to receiving the output V2a of the second transfer conductance varying portion 330, amplifying and outputting the same via the drain; and a MOS transistor 423 to which the fourth enable signal Vn4 is applied via the gate and which connects the drain to the common contact between the sources of the MOS transistors 421 and 422 and connects the source to the negative electrode supply source Vss.

The second common mode rejection ratio improving portion 410 includes: a second common mode rejection ratio control portion 430 for generating the control signal Vp2, which receives the outputs V1b and V2b of the differential amplifying portion 420 and improves the common mode rejection ratio; a MOS transistor 411 and a MOS transistor 412 which improve the common mode rejection ratio to the outputs V1b and V2b of the differential amplifying portion 420 by receiving the control signal Vp2 via the gate and respectively connect the drains and the sources to the positive electrode supply source Vcc and the drains of the MOS transistors 421 and 422.

As shown in FIG. 4, the second common mode rejection ratio control portion 430 includes: an input portion 350 for receiving the outputs of the differential amplifying portion 420, such as the first output signal V1b and the second output signal V2b in parallel; and an amplifying portion 360 for receiving the output of the input portion 350 and amplifying the same.

The input portion 350 includes: a first input portion 351 for receiving the first output signal V1b via a capacitor 351a and a resistor 351b, connected in parallel; a second input portion 352 for receiving the second output signal V2b via a capacitor 352a and a resistor 352b, connected in parallel.

The amplifying portion 360 includes: a MOS transistor 361 which is used as an active resistor by connecting the drain to the positive electrode supply source Vcc and connecting the gate to the source; a MOS transistor 362 which is used as an active resistor by connecting the drain to the positive electrode supply source Vcc and connecting the gate to the source; a MOS transistor 363 which receives the output of the input portion 350 via the gate and connects the drain to the common contact between the gate of the MOS transistor 361 and the source; a MOS transistor 364, which constitutes the differential amplifying portion with the MOS transistor 363, receives a reference voltage Vn3 via the gate and connects the drain to the common contact between the gate of the MOS transistor 362 and the source; a MOS transistor 365, which connects the drain to the common contact between the sources of the MOS transistors 363 and 364, receives the fourth enable signal Vn4 via the gate and connects the source to the negative electrode supply source Vss; and a capacitor 366 which feeds back the control signal Vp2 to the gate of the MOS transistor 363, wherein the control signal Vp2 is outputted via the drain of the MOS transistor 364.

The structure of the first common mode rejection ratio control portion 340 and that of the second common mode rejection ratio improving portion 430 are similar. Accordingly, the structure of the first common mode rejection ratio improving portion 340 will not be described in detail.

The operation of the first transfer conductance portion 110 and the first operational amplifying portion 120, which are included in the low frequency pass filtering means 100 of the time delay apparatus using the transfer conductance according to the present invention, will now be described hereinbelow with reference to FIGS. 3 and 4.

When the time delay apparatus using the transfer conductance according to the present invention maintains steady operation, the first and the second input signals V1 and V2, having the same source, are respectively received by the gates of the MOS transistors 322 and 333. The first and the second feedback signals V1F and V2F are respectively applied to the gates of the MOS transistors 323 and 332. Consequently, the transfer conductance of the first transfer conductance portion 300 is varied by varying an amount of voltage of the delay control signal Vtun, which is inputted into the gates of the MOS transistors 321 and 331.

In other words, when the gate-source voltage $V_{GS}$ of the MOS transistor 321 varies, each respective drain-source voltage $V_{DS}$ of each respective MOS transistor 322, 323, 332 and 333 is varied in proportion to the varying amount of the voltage $V_{GS}$.

Conventionally, the transfer conductance gm is a varying amount of the current, according to the applied gate-source voltage, in case that the drain of the MOS transistor is connected to the source, and is calculated by multiplying an amplification degree β of the MOS transistor by the drain-source voltage $V_{DS}$.

In other words, when each respective amplification degree β of the MOS transistors 322, 323, 332, 333 is the same, the respective transfer conductance $g_m$ of each MOS transistor 322, 323, 332 and 333 is as follows:

$$g_m = \beta \times V_{DS} \quad \text{(Function 2)}$$

The Function 2 indicates that the drain-source voltage $V_{DS}$ is varied in proportion to the voltage amount of the delay control signal Vtun and, accordingly, the transfer conductance $g_m$ is varied in proportion to the drain-source voltage $V_{DS}$.

That is, in the time delay apparatus using the transfer conductance as the parameter of the transfer function, the time delay is easily varied according to varying the delay control signal Vtun.

In the mean time, as above-mentioned, the strong point of using the duplicate input signals V1 and V2 and the duplicate feedback signals V1F and V2F is to reduce the noise effectively and to enlarge an active area of gain easily.

Consequently, the first transfer conductance varying portion 320 receives the first input signal V1 and the first feedback signal V1F for time delay and varies the transfer conductance according to the delay control signal Vtun. The second transfer conductance varying portion 330 receives the second input signal V2 and the second feedback signal V2F, which are respectively generated from the same source as those of the first input signal V1 and the first feedback signal V1F, and varies the transfer conductance according to the delay control signal Vtun.

Then, the first common mode rejection ratio improving portion 310 receives the output V1a and V2a of the first and the second transfer conductance varying portions 320 and 330 via the first common mode rejection ratio control portion 340, generates the control signal Vp3 for improving the common mode rejection ratio and supplies the control signal Vp3 to the gates of the MOS transistors 311 and 314. Accordingly, the noise component from the outputs V1a and V2a of the first and the second transfer conductance varying portions 320 and 330, which are received into the first operational amplifying portion 400, is reduced.

The differential amplifying portion 420 receives the outputs V1a and V2a of the first and the second transfer conductance varying portions 320 and 330, differentially amplifies and outputs the same. Then, the second common mode rejection ratio improving portion 410, similar to the first common mode rejection ratio improving portion 310, receives the outputs V1b and V2b of the differential amplifying portion 420 via the second common mode rejection ratio control portion 430, generates the control signal Vp2 for improving the common mode rejection ratio and supplies the control signal Vp2 to the gates of the MOS transistors 411 and 412. Accordingly, the second common mode rejection ratio improving portion 410 reduces the noise component from the outputs V1b and V2b of the first operational amplifying portion 400 and enlarges the active area of the gain.

The second common mode rejection ratio control portion 430 receives the first and the second output signals V1b and V2b of the differential amplifying portion 420 in parallel via the input portion 350 and the output of the amplifying portion 350 via the amplifying portion 360, differentially amplifies the same and generates the control signal Vp2.

Then, the input portion 350 receives the first output signal V1b via the capacitor 351a and the resistor 351b, connected in parallel, and the second output signal V2b via the capacitor 352a and the resistor 352b, connected in parallel, and supplies the same to the amplifying portion 360.

The amplifying portion 360 differentially amplifies the applied output of the input portion 350 by comparing the applied output with the reference voltage Vn3 inputted via the MOS transistor 364 and outputs the control signal Vp2 via the drain of the MOS transistor 364. Then, the capacitor 366 stores and outputs the control signal Vp2 by deeding back the control signal Vp2, outputted via the drain of the MOS transistor 364, to the gate of the MOS transistor 363.

As above-mentioned, the output of the input portion 350 and the reference voltage Vn3 having a predetermined level are compared, and the control signal Vp2 in accordance with the difference of the level of these signals is outputted. Then, the outputted control signal Vp2 is supplied to the common contact between the drains of the MOS transistors 411 and 412. Accordingly, the output level of the first operational amplifying portion 400 is controlled and the inputted common signal is effectively reduced.

As above-mentioned, according to the present invention, the time delay apparatus can provide an all-band pass filter having the required time delay, while maintaining the frequency gain of the input signal by using the transfer conductance and the low frequency pass filter. Further, the time delay apparatus in accordance with the present invention easily control the amount of the time delay by varying the transfer conductance of the MOS transistor from the outside.

Moreover, in accordance with the present invention, by using the MOS transistor it is easy to fabricate the time delay apparatus as a customized semiconductor. Further, by applying the time delay apparatus according to the present invention to each signal in a multiplexed signal processing system having respectively different delay characteristics, design cost is reduced and stability of system can be obtained.

As the terms mentioned in the specification are determined based upon the function of the present invention, and they can be changed according to the technician's intention or usual practice, the terms should be determined considering the overall contents of the specification of the present invention.

While there have been illustrated and described what are considered to be preferred embodiments of the present invention, it will be understood by those skilled in the art that various changes and modifications may be made, and equivalents may be substituted for components thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A time delay apparatus using a transfer conductance which is controlled by a voltage to generate a time delay, comprising:

a variable transfer conductance device including an active component to generate a variable transfer conductance in response to an external control signal; and a low frequency pass filtering device to receive an output from the transfer conductance device, to perform low frequency pass filtering on the output of the transfer conductance device and to output a time delayed signal.

2. A time delay apparatus as recited in claim 1, wherein the time delay apparatus operates as an all-band pass filter and the transfer conductance is a parameter of a transfer function of the all-band bass filter.

3. A time delay apparatus as recited in claim 1, wherein the low frequency pass filtering device includes a first low pass filter and a second low pass filter, and the transfer conductance device comprises a first transfer conductance device and a second transfer conductance device, and the first low pass filter receives an output of the first transfer conductance device, the second transfer conductance device receives an output of the first low pass filter, the second low pass filter receives an output of the second transfer conductance device, and the time delay apparatus further comprises: a feedback device to feed back the output of the second low pass filter to inputs of the first and second low pass filters, and to feed back the output of the second transfer conductance device to an input of the first transfer conductance device.

4. A time delay apparatus as recited in claim 1, wherein the transfer conductance device receives duplicate input signals.

5. A time delay apparatus as recited in claim 1, wherein the active component includes a Metal-Oxide Semiconductor (MOS) transistor.

6. A time delay apparatus as recited in claim 1, wherein said low frequency pass filtering device includes a first transfer conductance device and a second transfer conductance device connected to the first transfer conductance device.

7. A time delay apparatus as recited in claim 6, wherein the transfer conductance of the first transfer conductance device is half that of the second transfer conductance device.

8. A time delay apparatus as recited in claim 3, wherein the transfer conductance of the feedback device is the same as that of the first transfer conductance device.

9. A time delay apparatus as recited in claim 1, wherein the transfer conductance device comprises:

a first transfer conductance varying device to receive a first input signal and a first feedback signal for time delay and to vary the transfer conductance according to a delay control signal;

a second transfer conductance varying device to receive a second input signal and a second feedback signal, which are respectively generated from the same source as those of the first input signal and the first feedback signal, and to vary the transfer conductance according to the delay control signal; and a first common mode rejection ratio improving device to receive outputs of the first and said second transfer conductance varying devices and to improve a common mode rejection ratio.

10. A time delay apparatus as recited in claim 9, wherein the first transfer conductance varying device comprises:

a first MOS transistor having a gate to which the first input signal is applied and having a source connected to a negative electrode supply source;

a second MOS transistor having a gate to which the first feedback signal is applied and having a source connected to the negative electrode supply source;

a third MOS transistor having a gate to which the delay control signal is applied and having a source connected to a common contact between respective drains of the first MOS transistor and the second MOS transistor; and a MOS transistor to control transfer conductance, and having a gate to which a first enable signal is applied and which generates an output via a source connected to a drain of the third MOS transistor.

11. A time delay apparatus as recited in claim 9, wherein the second transfer conductance varying device comprises:

a first MOS transistor having a gate to which the second input signal is applied and having a source connected to a negative electrode supply source;

a second MOS transistor having a gate to which the second feedback signal is applied and having a source connected to the negative electrode supply source;

a third MOS transistor having a gate to which the delay control signal is applied and having a source connected to a common contact between respective drains of the first and second MOS transistors; and a fourth MOS transistor to control transfer conductance, and having a gate to which a first enable signal is applied and which generates an output via a source connected to a drain of the third MOS transistor.

12. A time delay apparatus as recited in claim 9, wherein the first common mode rejection ratio improving device comprises:

a first common mode rejection ratio control device to receive the outputs of the first and the second transfer conductance varying portions and to generate a control signal for improving the common mode rejection ratio;

a first MOS transistor and a second MOS transistor, having respective gates which receive the control signal for improving the common mode rejection ratio, and having respective drains connected to a positive electrode supply source, and having respective sources connected to the first and the second transfer conductance varying portions, to improve the common mode rejection ratio to the outputs of the first and the second transfer conductance varying devices;

a third MOS transistor having a gate to which a third enable signal is applied and having drain connected to the first transfer conductance varying device; and a fourth MOS transistor having a gate to which the third enable signal is applied and having a drain connected to the second transfer conductance varying device.

13. A time delay apparatus as recited in claim 9, wherein the low frequency pass filter device comprises:

an operational amplifying device to amplify an output of the transfer conductance device; and a passive component to feed back an output of the operational amplifying device to an input of the operational amplifying device.

14. A time delay apparatus as recited in claim 13, wherein the passive component includes a capacitor.

15. A time delay apparatus as recited in claim 13, wherein the operational amplifying device comprises:

a differential amplifying device to differentially amplify outputs of the first and second transfer conductance varying devices and to output first and second differentially amplified output signals; and a second common mode rejection ratio improving device to receive the first and the second output signals of the differential amplifying device and to improve a common mode rejection ratio.

16. A time delay apparatus as recited in claim 15, wherein the differential amplifying device comprises:
   a first MOS transistor having a gate to which the output of the first transfer conductance varying device is applied, and which amplifies and outputs the output of the first transfer conductance varying device via the drain;
   a second MOS transistor, operating as a differential amplifier with the first MOS transistor, to receive the output of the second transfer conductance varying device, and to amplify and output the output of the second transfer conductance varying device via a drain; and
   a third MOS transistor having a gate to which a fourth enable signal is applied, having a drain connected to a common contact between respective sources of the second and the third MOS transistors and having a source connected to the negative electrode supply source.

17. A time delay apparatus as recited in claim 16, wherein the second common mode rejection ratio improving device comprises:
   a second common mode rejection ratio control device to generate a control signal for receiving the first and the second output signals of the differential amplifying device and to improve the common mode rejection ratio; and
   a fourth MOS transistor and a fifth MOS transistor to improve the common mode rejection ratio to the first and second output signals of the differential amplifying device, and having respective gates to receive the control signal, having respective drains connected to the positive electrode supply source, and having respective sources connected to the drains of the second and the third MOS transistors.

18. A time delay apparatus as recited in claim 17, wherein the second common mode rejection ratio control device comprises:
   an input device to receive the first and the second output signals in parallel; and
   an amplifying device to amplify the received output of the input device.

19. A time delay apparatus as recited in claim 18, wherein the input device comprises:
   a first input device including a first capacitor and a first resistor connected in parallel to receive the first output signal; and
   a second input device including a second capacitor and a second resistor connected in parallel to receive the second output signal.

20. A time delay apparatus as recited in claim 18, wherein the amplifying device comprises:
   a sixth MOS transistor operating as an active resistor and having a drain connected to the positive electrode supply source and having a gate connected to a source;
   a seventh MOS transistor operating as an active resistor and having a drain connected to the positive electrode supply source and having a gate connected to a source;
   an eighth MOS transistor having a gate to receive an output of the input device and a drain connected to a common contact between the gate of the sixth MOS transistor and the source;
   a ninth MOS transistor operating as a differential amplifier with the eighth MOS transistor, and having a gate to receive a reference voltage and having a drain connected to a common contact between the gate of the seventh MOS transistor and the source;
   a tenth MOS transistor having a drain connected to a common contact between the sources of the eighth and the ninth MOS transistors, and having a gate to receive the fourth enable signal and a source connected to the negative electrode supply source; and
   a capacitor which feeds back the control signal to the gate of the eighth MOS transistor, wherein the control signal is outputted via the drain of the ninth MOS transistor.

21. A time delay apparatus using the transfer conductance in which an all-band pass filter is employed, comprising:
   a first low frequency pass filtering device to perform low frequency filtering, including
      a first transfer conductance device to receive a first input signal and a second input signal from a common source and to generate a first transfer conductance, and
      a first operational amplifying device to receive and amplify the output of the first transfer conductance device, and to feed back the amplified output to an input via a first capacitor;
   a second low frequency pass filtering device to perform low frequency filtering, including
      a second transfer conductance device to receive the output of the first low frequency pass filtering device and to generate a second transfer conductance which is a predetermined multiple of the first transfer conductance, and
      a second operational amplifying device to receive and amplify the output of the second transfer conductance device, and to feed back the amplified output to an input via a second capacitor;
   a first feedback device, including
      a first feedback transfer conductance device and a feedback capacitor for feeding back the output of the second transfer conductance device to an input terminal of the first low frequency pass filtering device, wherein the first feedback transfer conductance device and the feedback capacitor are connected in parallel;
   a second feedback transfer conductance device to feed back the output of the second operational amplifying device to an input terminal of the first operational amplifying device; and
   a third feedback transfer conductance device, connected to the second capacitor in parallel, to feed back an output of the second operational amplifying device to an input terminal of the second operational amplifying device.

22. A time delay apparatus as recited in claim 21, wherein the predetermined multiple is two.

23. A time delay apparatus as recited in claim 21, wherein the transfer conductances of the first, second and third feedback transfer conductance devices are respectively the same as that of the first transfer conductance device.

24. A time delay apparatus as recited in claim 21, wherein the first and the second operational amplifying devices have the same structure.

25. A time delay apparatus as recited in claim 21, wherein the first transfer conductance device has a dual-input structure.

26. A time delay apparatus as recited in claim 21, wherein the first transfer conductance device comprises:
   a first transfer conductance varying device to receive the first input signal and the first feedback signal for the time delay, and to vary the transfer conductance according to a delay control signal;
   a second transfer conductance varying device to receive the second input signal and the second feedback signal, which are respectively generated from the same source as those of the first input signal and the first feedback signal, and to vary the transfer conductance according to the delay control signal; and a first common mode rejection ratio improving device to receive outputs of the first and the second transfer conductance varying devices, and to improve the common mode rejection ratio.

27. A time delay apparatus as recited in claim 26, wherein the first transfer conductance varying device comprises:

a first MOS transistor having a gate to which the first input signal is applied and having a source connected to a negative electrode supply source;

a second MOS transistor having a gate to which the first feedback signal is applied and having a source connected to the negative electrode supply source;

a third MOS transistor having a gate to which the delay control signal is applied and having a source connected to a common contact between respective drains of the first and the second MOS transistors; and a MOS transistor to control transfer conductance, and having a gate to which a first enable signal is applied and which generates an output via a source connected to a drain of the third MOS transistor.

28. A time delay apparatus as recited in claim 26, wherein the second transfer conductance varying device comprises:

a first MOS transistor having a gate to which the second input signal is applied and having a source connected to a negative electrode supply source;

a second MOS transistor having a gate to which the second feedback signal is applied and having a source connected to the negative electrode supply source;

a third MOS transistor having a gate to which the delay control signal is applied and having a source connected to a common contact between respective drains of the first and the second MOS transistors; and a fourth MOS transistor having a gate to which a first enable signal is applied which generates an output via a source connected to the drain of the third MOS transistor.

29. A time delay apparatus as recited in claim 26, wherein the first common mode rejection ratio improving device comprises:

a first common mode rejection ratio control device to receive the outputs of the first and the second transfer conductance varying device; and to generate a control signal for improving the common mode rejection ratio;

a first MOS transistor and a second MOS transistor, having respective gates which receive the control signal for improving the common mode rejection ratio, and having respective drains connected to a positive electrode supply source, and having respective sources connected to the first and the second transfer conductance varying portions, to improve the common mode rejection ratio to the outputs of the first and the second transfer conductance varying devices;

a third MOS transistor having a gate to which a third enable signal is applied and having drain connected to the first transfer conductance varying device; and an fourth MOS transistor having a gate to which the third enable signal is applied and having a drain connected to the second transfer conductance varying device.

30. A time delay apparatus as recited in claim 10, wherein the second transfer conductance varying portion comprises:

a fourth MOS transistor having a gate to which the second input signal is applied and having a source connected to a negative electrode supply source;

a fifth MOS transistor having a gate to which the second feedback signal is applied and having a source connected to the negative electrode supply source;

a sixth MOS transistor having a gate to which the delay control signal is applied and having a source connected to a common contact between respective drains of the fourth and the fifth MOS transistors; and a seventh MOS transistor to control transfer conductance, and having a gate to which a first enable signal is applied and which generates an output via a source connected to a drain of the sixth MOS transistor.

31. A time delay apparatus as recited in claim 30, wherein the first common mode rejection ratio improving device comprises:

a first common mode rejection ratio control device to receive the outputs of the first and the second transfer conductance varying portions and to generate a control signal for improving the common mode rejection ratio;

an eighth MOS transistor and a ninth MOS transistor, having respective gates which receive the control signal for improving the common mode rejection ratio, and having respective drains connected to a positive electrode supply source, and having respective sources connected to the first and the second transfer conductance varying portions, to improve the common mode rejection ratio to the outputs of the first and the second transfer conductance varying devices;

a tenth MOS transistor having a gate to which a third enable signal is applied and having drain connected to the first transfer conductance varying device; and an eleventh MOS transistor having a gate to which the third enable signal is applied and having a drain connected to the second transfer conductance varying device.

32. A time delay apparatus as recited in claim 31, wherein the low frequency pass filter device comprises:

an operational amplifying device to amplify an output of the transfer conductance device; and a passive component to feed back an output of the operational amplifying device to an input of the operational amplifying device.

33. A time delay apparatus as recited in claim 32, wherein the passive component includes a capacitor.

34. A time delay apparatus as recited in claim 32, wherein the operational amplifying device comprises:

a differential amplifying device to differentially amplify outputs of the first and second transfer conductance varying devices and to output first and second differentially amplified output signals; and a second common mode rejection ratio improving device to receive the first and the second output signals of the differential amplifying device and to improve a common mode rejection ratio.

35. A time delay apparatus as recited in claim 34, wherein the differential amplifying device comprises:

a twelfth MOS transistor having a gate to which the output of the first transfer conductance varying device is applied, and which amplifies and outputs the output of the first transfer conductance varying device via the drain;

a thirteenth MOS transistor, operating as a differential amplifier with the twelfth MOS transistor, to receive the output of the second transfer conductance varying device, and to amplify and output the output of the second transfer conductance varying device via a drain; and a fourteenth MOS transistor having a gate to which a fourth enable signal is applied, having a drain connected to a common contact between respective sources of the thirteenth and the fourteenth MOS transistors and having a source connected to the negative electrode supply source.

36. A time delay apparatus as recited in claim 35, wherein the second common mode rejection ratio improving device comprises:

a second common mode rejection ratio control device to generate a control signal for receiving the first and the second output signals of the differential amplifying device and to improve the common mode rejection ratio; and a fifteenth MOS transistor and a sixteenth MOS transistor to improve the common mode rejection ratio to the first and second output signals of the differential amplifying device, and having respective gates to receive the control signal, having respective drains connected to the positive electrode supply source, and having respective sources connected to the drains of the thirteenth and the fourteenth MOS transistors.

37. A time delay apparatus as recited in claim 36, wherein the second common mode rejection ratio control device comprises:

an input device to receive the first and the second output signals in parallel; and an amplifying device to amplify the received output of the input device.

38. A time delay apparatus as recited in claim 37, wherein the input device comprises:

a first input device including a first capacitor and a first resistor connected in parallel to receive the first output signal; and a second input device including a second capacitor and a second resistor connected in parallel to receive the second output signal.

39. A time delay apparatus as recited in claim 37, wherein the amplifying device comprises:

a seventeenth MOS transistor operating as an active resistor and having a drain connected to the positive electrode supply source and having a gate connected to a source;

an eighteenth MOS transistor operating as an active resistor and having a drain connected to the positive electrode supply source and having a gate connected to a source;

a nineteenth MOS transistor having a gate to receive an output of the input device and a drain connected to a common contact between the gate of the seventeenth MOS transistor and the source;

a twentieth MOS transistor operating as a differential amplifier with the nineteenth MOS transistor, and having a gate to receive a reference voltage and having a drain connected to a common contact between the gate of the eighteenth MOS transistor and the source;

a twenty-first MOS transistor having a drain connected to a common contact between the sources of the nineteenth and the twentieth MOS transistors, and having a gate to receive the fourth enable signal and a source connected to the negative electrode supply source; and a capacitor which feeds back the control signal to the gate of the nineteenth MOS transistor, wherein the control signal is outputted via the drain of the twentieth MOS transistor.

40. A time delay apparatus as recited in claim 27, wherein the second transfer conductance varying device comprises:

a fourth MOS transistor having a gate to which the second input signal is applied and having a source connected to a negative electrode supply source;

a fifth MOS transistor having a gate to which the second feedback signal is applied and having a source connected to the negative electrode supply source;

a sixth MOS transistor having a gate to which the delay control signal is applied and having a source connected to a common contact between respective drains of the fourth and the fifth MOS transistors; and a seventh MOS transistor having a gate to which a first enable signal is applied which generates an output via a source connected to the drain of the sixth MOS transistor.

41. A time delay apparatus as recited in claim 40, wherein the first common mode rejection ratio improving device comprises:

a first common mode rejection ratio control device to receive the outputs of the first and the second transfer conductance varying device; and to generate a control signal for improving the common mode rejection ratio;

an eighth MOS transistor and a ninth MOS transistor, having respective gates which receive the control signal for improving the common mode rejection ratio, and having respective drains connected to a positive electrode supply source, and having respective sources connected to the first and the second transfer conductance varying portions, to improve the common mode rejection ratio to the outputs of the first and the second transfer conductance varying devices;

a tenth MOS transistor having a gate to which a third enable signal is applied and having drain connected to the first transfer conductance varying device; and an eleventh MOS transistor having a gate to which the third enable signal is applied and having a drain connected to the second transfer conductance varying device.

* * * * *